United States Patent [19]
Hayashi

[11] Patent Number: 5,822,192
[45] Date of Patent: Oct. 13, 1998

[54] CASE SEALING STRUCTURE AND ASSEMBLING METHOD THEREFOR

[75] Inventor: Yoshiaki Hayashi, Miyagi-ken, Japan

[73] Assignee: Alps Electric Co. Ltd., Japan

[21] Appl. No.: 657,450

[22] Filed: May 29, 1996

[30] Foreign Application Priority Data

Jun. 20, 1995 [JP] Japan .................................. 7-153453

[51] Int. Cl.⁶ ..................................................... H05K 5/06
[52] U.S. Cl. ........................ 361/752; 361/759; 361/748; 174/50; 174/50.54
[58] Field of Search ..................................... 361/736, 748, 361/752, 759, 757, 679, 680; 174/50, 50.51, 50.52, 52.3, 17 R, 17.05, 17.06, 50.54

[56] References Cited

U.S. PATENT DOCUMENTS

| | | | |
|---|---|---|---|
| 3,733,807 | 5/1973 | Nozawa | 368/291 |
| 4,683,519 | 7/1987 | Murakami | 361/680 |
| 4,980,522 | 12/1990 | Murakami et al. | 200/5 A |
| 5,334,799 | 8/1994 | Naito et al. | 174/17 VA |

FOREIGN PATENT DOCUMENTS 4-6462  1/1992  Japan .

Primary Examiner—Leo P. Picard
Assistant Examiner—Jayprakash N. Gandhi
Attorney, Agent, or Firm—Brinks Hofer Gilson & Lione

[57] ABSTRACT

Disclosed herein is a case sealing structure and an assembling method therefor which can realize the dustproof and waterproof performances of the case with a simple configuration and reliability. The case sealing structure includes an upper case having a top portion and a side portion to define a lower opening; a lower case having a bottom portion and a side portion to define an upper opening, the lower case being engaged with the upper case with the lower opening and the upper opening facing each other; and an elastic sealing member having a top portion and a side portion, the sealing member being stored in the upper and lower cases. The inner surface of the side portion of the sealing member is formed with a groove engaging with the outer periphery of a printed board. The sealing member is held between the outer periphery of the printed board engaging with the groove and the inner surface of the side portion of the upper case.

8 Claims, 2 Drawing Sheets

CASE SEALING STRUCTURE AND ASSEMBLING METHOD THEREFOR

BACKGROUND OF THE INVENTION

The present invention relates to a dustproof and waterproof sealing structure for a case of equipment such as a transmitter.

In a portable transmitter held by a user to lock or unlock a vehicle door at a position remote from the vehicle, or in a transmitter for use with a garage opener for opening and closing a garage door from inside of the vehicle, such a transmitter is sometimes used outdoors, and exposure to dust and rain is likely. It is therefore necessary to prevent entry of dust and water into a case of the transmitter. To this end, the case is usually provided with a dustproof and a waterproof sealing structure. A printed board on which electronic components are mounted is held in the case. To protect the printed board from external vibration and shock in inadvertently dropping the transmitter, the printed board is provided with a damper, or is firmly fixed to the case by hooks.

Such a case of the transmitter is composed of an upper case and a lower case joined together with an internal space defined therebetween. A sealing member of rubber is interposed between the upper case and the lower case, and a printed board on which electronic components are mounted is provided in the internal space defined between the upper and lower cases. The upper case has a plurality of button openings for insertion of a plurality of operation buttons. The operation buttons are inserted through the button openings from the back side of the upper case. The lower case has an opening for replacement of a battery as a power source. This opening is normally closed by a detachable lid. The sealing member of rubber covers the electronic components mounted on the printed board to protect the electronic components from dust and water. The operation buttons are provided on the surface of the sealing member opposed to the printed board. When any of the operation buttons is depressed, a corresponding one of push switches mounted on the printed board is operated.

In assembling such a conventional case as mentioned above, the upper case is overturned and the sealing member is next put into the upper case. Then, the printed board is fixed by hooks or positioning projections formed on either the upper case or the lower case with a play, and the lower case is next joined to the upper case pressing down the printed board. However, there is a possibility of degradation in dustproof and waterproof performances due to dimensional errors or age deterioration of the upper and lower cases and the sealing member. Further, in inserting the overturned operation buttons manually through the button openings of the upper case and from the back side of the upper case, it is necessary to ensure that function labels such as symbols or pictures provided on the tops of the operation buttons coincide with the corresponding button openings of the upper case. Accordingly, there is a possibility of erroneous assembly of the operation buttons. Further, in replacing the battery, the lid that closes the opening of the lower case is removed. Accordingly, a spacing tends to be defined between the lid and the opening of the lower case, possibly causing a degradation in dustproof and waterproof performances.

SUMMARY OF THE INVENTION

It is accordingly a first object of the present invention to provide a case sealing structure which can realize the dustproof and the waterproof performances of the case with a simple configuration and reliability.

It is a second object of the present invention to provide a case sealing structure which can eliminate the possibility of erroneous assembly of the operation buttons.

It is a third object of the present invention to provide an assembling method for a transmitter which allows the assembling of the dustproof and waterproof case in simple steps.

According to an aspect of the present invention, there is provided a case sealing structure comprising a case comprising an upper case having a lower opening and a lower case having an upper opening, the upper case and the lower case being assembled together with the lower opening facing the upper opening; an elastic sealing member stored in the case and having an inner wall portion formed with a groove extending over the surface of the inner wall portion; and a printed board engaged with the groove formed on the inner wall portion of the sealing member; the sealing member being held between an outer periphery of the printed board and an inner wall portion of the case.

With this structure, the outer periphery of the printed board on which electronic components or the like are mounted is engaged with the groove formed on the inner wall portion of the sealing member. Accordingly, external vibration, drop shock, etc. to the printed board can be suppressed by the sealing member. Furthermore, the sealing member is held between the outer periphery of the printed board and the inner wall portion of the case. Accordingly, entry of dust and water into the space defined between the case and the sealing member can be prevented. In addition, the number of parts can be reduced to thereby reduce the cost.

Preferably, the case is formed with a plurality of projections abutting against the inner wall portion of the sealing member, and the sealing member is held between the projections and the inner wall portion of the case.

With this structure, the case has a plurality of projections abutting against the inner wall portion of the sealing member, and the sealing member is held between these projections of the case and the inner wall portion of the case. Accordingly, the sealing member can be firmly fixed within the case.

Preferably, the upper case is formed with a plurality of operation button openings, and the sealing member is integrally formed with a plurality of operation buttons exposed to the operation button openings of the upper case.

With this structure, the operation buttons are formed integrally with the top portion of the sealing member. Accordingly, the operation buttons can be easily installed by simply inserting the operation buttons into the operation button openings of the upper case in putting the sealing member into the upper case. That is, the sealing member serves also as an elastic sheet for operation buttons. Accordingly, the number of parts can be reduced, and possible erroneous assembly of the operation buttons can be eliminated.

According to another aspect of the present invention, there is provided an assembling method for a transmitter, comprising the first step of mounting a terminal member in a battery holder provided on a bottom portion of a lower case, the terminal member being formed so as to correspond to a shape of the battery holder; the second step of installing a battery as a power source into the battery holder so as to make an outer periphery of the battery come into contact with the terminal member; the third step of engaging a printed board with a groove formed on an inner wall portion of an elastic sealing member over the surface thereof; the fourth step of installing the sealing member into an upper case; and the fifth step of engaging the lower case and the upper case.

With this method, the transmitter can be assembled in a reduced number of steps with a reduced number of parts and an improved efficiency.

Alternatively, the third and fourth steps may be performed prior to the first and second steps. Also in this case, substantially the same effect as that of the above method can be obtained.

Other objects and features of the invention will be more fully understood from the following detailed description and appended claims when taken with the accompanying drawings.

DETAILED DESCRIPTION OF THE PREFERRED EMBODIMENTS

A preferred embodiment of the present invention will now be described with reference to FIGS. 1 to 3.

Figure 1:
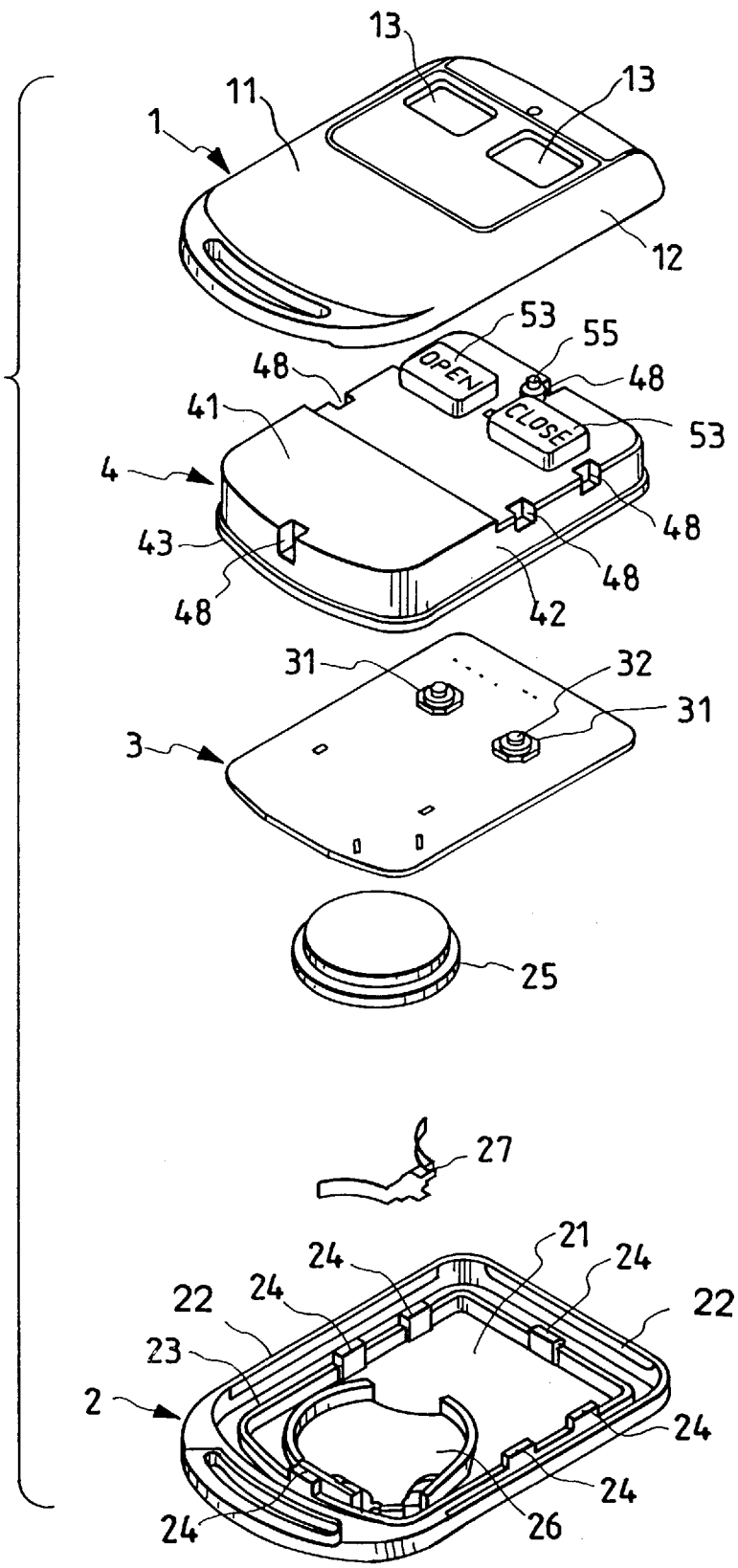
FIG. 1 is an exploded perspective view of a transmitter according to a preferred embodiment of the present invention.
Figure 2:
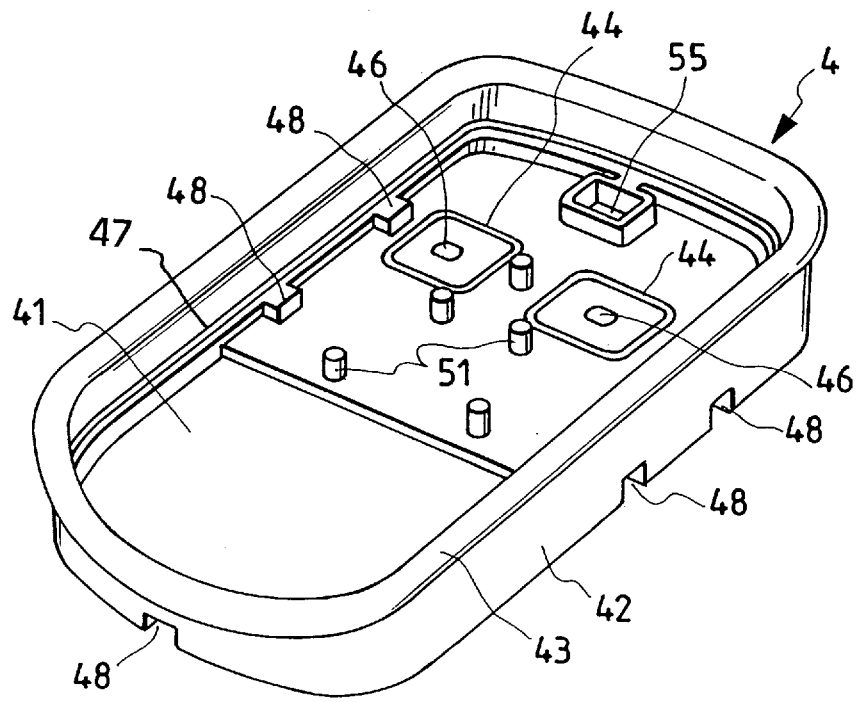
FIG. 2 is a perspective view of a sealing member in the transmitter shown in FIG. 1 in the condition where the sealing member is overturned.

Referring to FIG. 1, there is shown a transmitter according to a preferred embodiment of the present invention. The transmitter is composed generally of a case formed of synthetic resin or the like, an elastic sealing member 4 formed of elastic rubber or the like, and a printed board 3 on which electronic components or the like are mounted. The case is composed of an upper case 1 and a lower case 2 engaged with the upper case 1. The printed board 3 is housed in the sealing member 4.

The upper case 1 has a top portion 11 and a side portion 12 projecting downward from the outer periphery of the top portion 11, thus defining a lower opening. The top portion 11 is formed with a plurality of openings 13 for respectively exposing a plurality of operation buttons (on which different kinds of functions are labeled) of the sealing member 4 to be hereinafter described. The inner surface of the top portion 11 of the upper case 1 is formed with a plurality of projections 52 adapted to respectively engage with a plurality of recesses 48 of the sealing member 4 to be hereinafter described. The side portion 12 of the upper case 1 is formed at its lower end with a projection 54 adapted to abut against a flange 43 of the sealing member 4 to be hereinafter described. Further, the outer surface of the side portion 12 of the upper case 1 is formed with a plurality of projections 49 for fixing the upper and lower cases 1 and 2.

The lower case 2 has a bottom portion 21 and a side portion 22 projecting upward from the outer periphery of the bottom portion 21, thus defining an upper opening. The lower case 2 is adapted to engage with the upper case 1 in such a manner that the upper opening of the lower case 2 faces the lower opening of the upper case 1. The inner surface of the bottom portion 21 of the lower case 2 is formed with a substantially rectangular rib 23 spaced from the side portion 22 and extending along the whole length of the side portion 22. The rib 23 is integrally formed at its upper end with a plurality of spaced projections 24 adapted to abut against the lower surface of the printed board 3 near its outer periphery. Further, the inner surface of the bottom portion 21 inside the rib 23 is formed with a battery holder 26 for holding a battery 25 as a power source. A terminal member 27 formed of conductive metal is mounted inside the battery holder 26. The terminal member 27 has a shape corresponding to the shape of the battery 25 in such a manner as to abut against the outer periphery of the battery 25. Further, the inner surface of the side portion 22 of the lower case 2 is formed with a plurality of ridges 50 adapted to respectively engage with the projections 49 of the side portion 12 of the upper case 1.

The sealing member 4 has a top portion 41 and a side portion 42 projecting downward from the outer periphery of the top portion 41, thus defining a lower opening. The side portion 42 is formed at its lower end with a flange 43 projecting outward at substantially right angles to the side portion 42. The inner surface of the top portion 41 of the sealing member 4 is formed with a plurality of annular grooves 44 each having a rectangular shape corresponding to the shape of each opening 13 of the upper case 1. Inside each annular groove 44, the outer surface of the top portion 41 integrally projects upward to form push buttons (operation buttons) 53. Accordingly, each push button 53 integral with the sealing member 4 is exposed to the corresponding opening 13 of the upper case, and is easily operated by the formation of the corresponding annular groove 44. The lower surface of each push button 53 is formed at its center with a projection 46 opposed to a stem 32 of a push switch 31 to be hereinafter described. The inner surface of the side portion 42 of the sealing member 4 is formed with a groove 47 adapted to fully engage with the outer periphery of the printed board 3. As described above, the outer flange 43 is formed along the lower opening of the sealing member 4. As best shown in FIG. 3, the flange 43 of the sealing member 4 is held between the bottom portion 21 of the lower case 2 and the projection 54 formed at the lower end of the side portion 21 of the upper case 1 in the condition that the upper and lower cases 1 and 2 are assembled. Thus, the sealing member 4 is firmly fixed within the case so that the flange 43 of the sealing member 4 is pressed on the bottom portion 21 of the lower case 2, thereby preventing entry of dust and water into the space defined between the sealing member 4 and the lower case 2.

Reference numerals 51 denote a plurality of cylindrical supports projecting downward from the inner surface of the top portion 41 of the sealing member 4 to support the printed board 3. Reference numeral 55 denotes a domed elastic portion projecting from the outer surface of the top portion 41 of the sealing member 4 so as to elastically abut against the inner surface of the top portion 11 of the upper case 1.

A plurality of push switches 31 each having a stem 32 are mounted on the upper surface of the printed board 3 in such a position that when the outer periphery of the printed board 3 is engaged with the groove 47 of the sealing member 4, the stems 32 of the push switches 31 respectively face the projections 46 of the sealing member 4.

A method of assembling the case of the transmitter described above will now be described.

First, the terminal member 27 is mounted inside the battery holder 26 formed on the bottom portion 21 of the lower case 2, and the battery 25 is next mounted inside the battery holder 26 so that the outer periphery of the battery 25 comes into contact with the terminal member 27. In the next step, the printed board 3 is placed in the sealing member 4 by engaging the outer periphery of the printed board 3 with the groove 47 of the side portion 42 of the sealing member 4 so that the projections 46 of the push buttons 53 formed at the top portion 41 of the sealing member 4 are opposed to the corresponding stems 32 of the push switches 31 mounted on the printed board 3. In the next step, the sealing member 4 in which the printed board 3 is placed is put into the upper case 1 so that the push buttons 53 of the sealing member 4 are exposed to the corresponding openings 13 of the upper case 1. Finally, the upper case 1 and the lower case 2 are firmly assembled together in such a manner that the lower opening of the upper case 1 and the upper opening of the lower case 2 face each other, by engaging the projections 49 of the upper case 1 with the ridges 50 of the lower case 2 as shown in FIG. 3. Alternatively, one of the upper case 1 and the lower case 2 may be formed with projections or ridges, and the other may be formed with recesses adapted to engage with the projections or the ridges.

Figure 3:
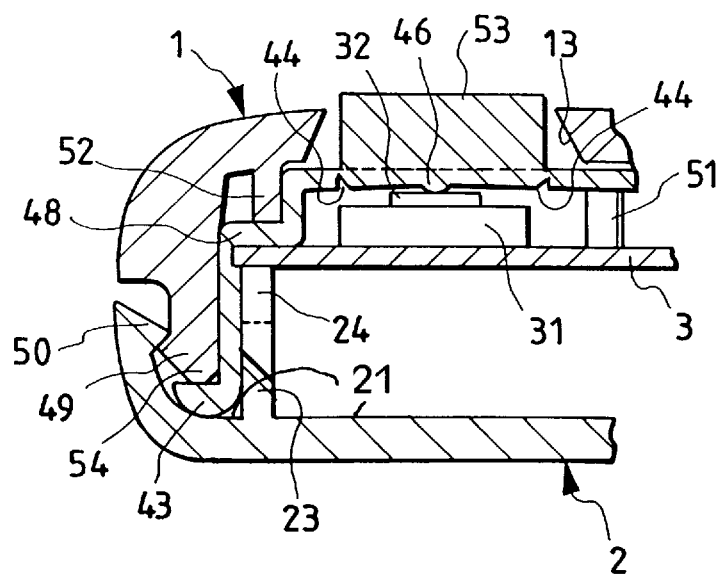
FIG. 3 is a vertical sectional view of an essential part of the transmitter in the assembled condition.

In the preferred embodiment mentioned above, the sealing member 4 and the printed board 3 are vertically held by the projections 52 of the upper case 1 and the projections 24 of the lower case 2 as shown in FIG. 3. The outer periphery of the printed board 3 is engaged with the groove 47 of the sealing member 4, and the sealing member 4 is horizontally held by the side portion 12 of the upper case 1 and the ribs 23 and the projections 24 of the lower case 2 as shown in FIG. 3. Furthermore, the flange 43 of the sealing member 4 is held between the projection 54 at the lower end of the side portion 12 of the upper case 1 and the bottom portion 21 of the lower case 2 as shown in FIG. 3.

Accordingly, the sealing member 4 is firmly fixed within the case, and the flange 43 is kept in close contact with the bottom portion 21 of the lower case 2, thereby reliably protecting the printed board 3 in the sealing member 4 from dust and water. Further, the sealing member 4 functions also as a damper against external vibration, shock in dropping the transmitter, for example. Accordingly, vibration, shock, etc. to be transmitted to the printed board 3 can be suppressed.

Further, the battery 25 is stored in the battery holder 26 formed on the bottom portion 21 of the lower case 2, and any opening and lid for replacement of the battery are not provided on the case. Accordingly, there is no possibility of entry of dust and water from such an opening and any spacing between this opening and the lid as in the prior art. In replacing the battery 25 with another battery, the upper case 1 and the lower case 2 may be merely separated from each other. That is, by separating the upper case 1 from the lower case 2, the sealing member 4 is separated together with the upper case 1, so that the battery holder 26 can be exposed.

Further, the steps of assembly of the upper case 1 may be performed prior to the steps of assembly of the lower case 1. Also in this case, similar effects can be exhibited.

While the invention has been described with reference to a specific embodiment, the description is illustrative and is not to be construed as limiting the scope of the invention. Various modifications and changes may occur to those skilled in the art without departing from the spirit and scope of the invention as defined by the appended claims.

What is claimed is:

1. A case sealing structure comprising:
   a case comprising an upper case having a lower opening and a lower case having an upper opening, said upper case and said lower case being assembled together with said lower opening facing said upper opening;
   a sealing member stored in said case and having an inner wall portion formed with a groove extending over the surface of said inner wall portion; and
   a printed board engaged with said groove formed on said inner wall portion of said sealing member; said sealing member being held between an outer periphery of said printed board and an inner wall portion of said upper case.

2. A case sealing structure according to claim 1, wherein said lower case is formed with a plurality of projections abutting against said inner wall portion of said sealing member, and said sealing member is held between said projections and said inner wall portion of said upper case.

3. A case sealing structure according to claim 1, wherein said upper case is formed with a plurality of operation button openings, and said sealing member is integrally formed with a plurality of operation buttons exposed to said operation button openings of said upper case.

4. A case sealing structure according to claim 1, wherein said upper case includes a plurality of projections, and said sealing member includes a plurality of recesses, said recesses receiving said projections.

5. A case sealing structure according to claim 1, wherein said lower case includes a bottom portion and a side portion, said bottom portion including a substantially rectangular annular rib spaced from the side portion and extending along the side portion, and wherein said sealing member is held between said rib and said inner wall portion of said upper case.

6. A case sealing structure according to claim 5, wherein said rib includes a plurality of rib projections abutting against said inner wall portion of said sealing member, and said sealing member is held between said rib projections and said inner wall portion of said upper case.

7. A case sealing structure according to claim 6, wherein said upper case includes a plurality of upper case projections aligned with said plurality of rib projections, and said sealing member includes a plurality of recesses, said recesses receiving said upper case projections.

8. A case sealing structure comprising:
   a case comprising:
      an upper case having a lower opening and an operation button opening; and
      a lower case having an upper opening and a plurality of projections; said upper case and said lower case being assembled together with said lower opening facing said upper opening;
   a sealing member stored in said case including:
      an inner wall portion formed with a groove extending over the surface of said inner wall portion; and
      an integrally formed operation button, said operation button being exposed to said operation button opening; and
   a printed board engaged with said groove formed on said inner wall portion of said sealing member, said sealing member being held between an outer periphery of said printed board and an inner wall portion of said upper case, said sealing member also being held between said projections and said inner wall portion of said upper case.

* * * * *